(12) United States Patent
Yoshikawa

(10) Patent No.: US 10,972,057 B2
(45) Date of Patent: Apr. 6, 2021

(54) SINGLE-PHASE DIFFERENTIAL CONVERSION CIRCUIT, SIGNAL PROCESSING METHOD FOR USE THEREWITH, AND RECEPTION APPARATUS

(71) Applicant: SONY SEMICONDUCTOR SOLUTIONS CORPORATION, Kanagawa (JP)

(72) Inventor: Naoto Yoshikawa, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 36 days.

(21) Appl. No.: 16/466,201

(22) PCT Filed: Dec. 6, 2017

(86) PCT No.: PCT/JP2017/043759
§ 371 (c)(1),
(2) Date: Jun. 3, 2019

(87) PCT Pub. No.: WO2018/116825
PCT Pub. Date: Jun. 28, 2018

(65) Prior Publication Data
US 2020/0076377 A1 Mar. 5, 2020

(30) Foreign Application Priority Data
Dec. 20, 2016 (JP) .............................. JP2016-246105

(51) Int. Cl.
*H03F 3/45* (2006.01)
*H03F 1/32* (2006.01)
(Continued)

(52) U.S. Cl.
CPC ............ *H03F 1/3205* (2013.01); *H03F 1/12* (2013.01); *H03F 1/3211* (2013.01);
(Continued)

(58) Field of Classification Search
CPC ..... H03F 3/45; H03F 2200/06; H03F 2200/09
(Continued)

(56) References Cited

U.S. PATENT DOCUMENTS 7,504,886 B2 * 3/2009 Kataria ................. H03F 1/0266
330/256
2005/0200412 A1 9/2005 Kaizaki
(Continued)

FOREIGN PATENT DOCUMENTS

| CN | 104335487 A | 2/2015 |
| EP | 2858242 A1 | 4/2015 |

(Continued)

OTHER PUBLICATIONS

International Search Report and Written Opinion of PCT Application No. PCT/JP2017/043759, dated Feb. 27, 2018, 08 pages of ISRWO.

*Primary Examiner* — Steven J Mottola
(74) *Attorney, Agent, or Firm* — Chip Law Group

(57) ABSTRACT

This technology relates to a single-phase differential conversion circuit for improving the linearity of input/output characteristics, a signal processing method for use with the circuit, and a reception apparatus. The single-phase differential conversion circuit includes a first source-grounded amplifier and a second source-grounded amplifier. Each of the amplifiers includes a transconductance amplifier section including a transistor for converting an AC component of input potential to a current, a diode load section including a transistor in a diode connection configured as a first load, and a large-signal distortion compensation circuit config- (Continued)

ured as a second load connected in parallel with the first load. The transistors of the first source-grounded amplifier are each a P-type MOS transistor, and the transistors of the second source-grounded amplifier are each an N-type MOS transistor. This technology is applied advantageously to a reception apparatus for receiving TV signals, for example.

12 Claims, 8 Drawing Sheets

(51) Int. Cl.
    *H03F 1/12*           (2006.01)
    *H03F 3/68*           (2006.01)
    *H03G 3/30*           (2006.01)
    *H04B 1/16*           (2006.01)

(52) U.S. Cl.
    CPC ........... *H03F 3/45179* (2013.01); *H03F 3/68* (2013.01); *H03G 3/3068* (2013.01); *H03F 2200/387* (2013.01); *H03F 2200/451* (2013.01); *H03F 2203/45654* (2013.01); *H03G 2201/103* (2013.01); *H03G 2201/106* (2013.01); *H03G 2201/305* (2013.01); *H03G 2201/307* (2013.01); *H04B 1/16* (2013.01)

(58) Field of Classification Search
    USPC .................................................. 330/253, 301
    See application file for complete search history.

(56) References Cited

U.S. PATENT DOCUMENTS

| | | |
|---|---|---|
| 2010/0182093 A1 | 7/2010 | Hasegawa |
| 2015/0092892 A1 | 4/2015 | Yoshikawa et al. |

FOREIGN PATENT DOCUMENTS

| | | |
|---|---|---|
| JP | 2005-286993 A | 10/2005 |
| JP | 2015-170892 A | 9/2015 |
| WO | 2009/044441 A1 | 4/2009 |
| WO | 2013/179890 A1 | 12/2013 |

* cited by examiner

F I G. 5
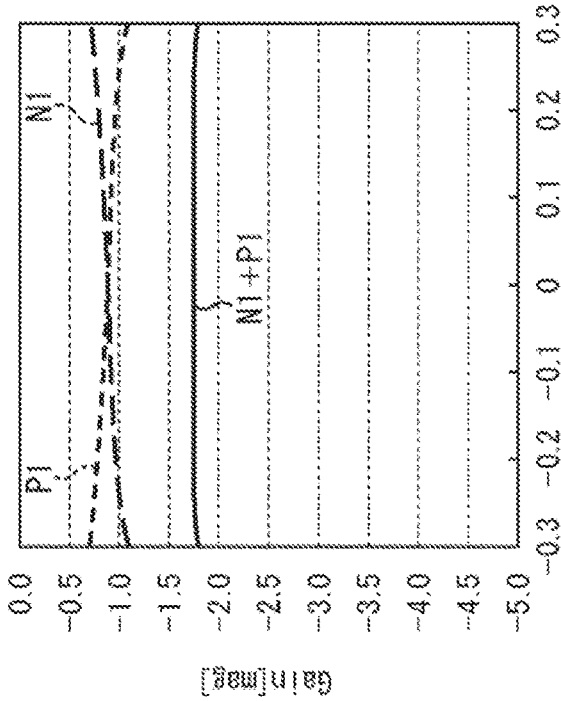
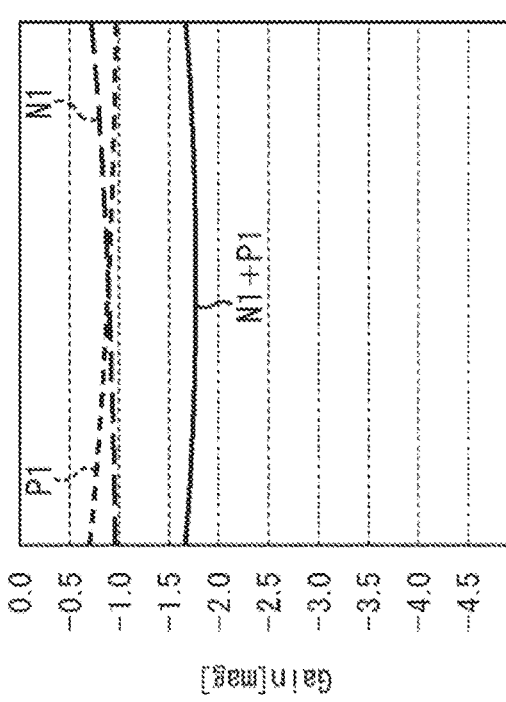

SINGLE-PHASE DIFFERENTIAL CONVERSION CIRCUIT, SIGNAL PROCESSING METHOD FOR USE THEREWITH, AND RECEPTION APPARATUS

CROSS REFERENCE TO RELATED APPLICATIONS

This application is a U.S. National Phase of International Patent Application No. PCT/JP2017/043759 filed on Dec. 6, 2017, which claims priority benefit of Japanese Patent Application No. JP 2016-246105 filed in the Japan Patent Office on Dec. 20, 2016. Each of the above-referenced applications is hereby incorporated herein by reference in its entirety.

TECHNICAL FIELD

The present technology relates to a single-phase differential conversion circuit, a signal processing method for use therewith, and a reception apparatus. More particularly, the technology relates to a single-phase differential conversion circuit for improving the linearity of input/output characteristics, a signal processing method for use with the single-phase differential conversion circuit, and a reception apparatus.

BACKGROUND ART

Differential signals are less susceptible, for example, to the effects noise (in-phase noise) than single-phase signals. Alternatively, The differential signal may otherwise be doubled in signal range. Thus differential circuits are frequently used in cases where analog signals with relatively small amplitude, for example, are to be dealt with.

A single-phase signal is converted to a differential signal by a single-phase differential conversion circuit before being supplied to a differential circuit. In particular, in the case where analog signals having relatively small amplitude are to be handled, it is important to improve signal-to-noise ratio (S/N ratio). Patent Literature 1, for example, discloses a single-phase differential conversion circuit that minimizes noise.

CITATION LIST

Patent Literature

[PTL 1]
   WO 2013/179890

SUMMARY

Technical Problem

Also, single-phase differential conversion circuits are expected to further improve the linearity of input/output characteristics.

The present technology has been devised in view of the above circumstances and aims to provide improved linearity of input/output characteristics.

Solution to Problem

A single-phase differential conversion circuit according to a first aspect of the present technology includes a first source-grounded amplifier and a second source-grounded amplifier. Each of the source-grounded amplifiers includes a transconductance amplifier section including a transistor for converting an AC component of input potential to a current, a diode load section including a transistor in a diode connection configured as a first load, and a large-signal distortion compensation circuit configured as a second load connected in parallel with the first load. The transistors of the first source-grounded amplifier are each a P-type MOS transistor. The transistors of the second source-grounded amplifier are each an N-type MOS transistor.

Thus according to the first aspect of the present technology, there are provided a first source-grounded amplifier and a second source-grounded amplifier. Each of the source-grounded amplifiers includes a transconductance amplifier section including a transistor for converting an AC component of input potential to a current, a diode load section including a transistor in a diode connection configured as a first load, and a large-signal distortion compensation circuit configured as a second load connected in parallel with the first load. The transistors of the first source-grounded amplifier are each a P-type MOS transistor. The transistors of the second source-grounded amplifier are each an N-type MOS transistor.

A signal processing method according to a second aspect of the present technology is for use with a single-phase differential conversion circuit including a first source-grounded amplifier and a second source-grounded amplifier. Each of the source-grounded amplifiers includes a transconductance amplifier section including a transistor for converting an AC component of input potential to a current, a diode load section including a transistor in a diode connection configured as a first load, and a large-signal distortion compensation circuit configured as a second load connected in parallel with the first load. The transistors of the first source-grounded amplifier are each a P-type MOS transistor. The transistors of the second source-grounded amplifier are each an N-type MOS transistor. The signal processing method includes causing the first source-grounded amplifier to compensate for a drop in gain of the second source-grounded amplifier, and causing the second source-grounded amplifier to compensate for a drop in gain of the first-source-grounded amplifier.

Thus according to the second aspect of the present technology, there are provided a first source-grounded amplifier and a second source-grounded amplifier. Each of the source-grounded amplifiers includes a transconductance amplifier section including a transistor for converting an AC component of input potential to a current, a diode load section including a transistor in a diode connection configured as a first load, and a large-signal distortion compensation circuit configured as a second load connected in parallel with the first load. The transistors of the first source-grounded amplifier are each a P-type MOS transistor. The transistors of the second source-grounded amplifier are each an N-type MOS transistor. The first source-grounded amplifier is caused to compensate for a drop in gain of the second source-grounded amplifier. The second source-grounded amplifier is caused to compensate for a drop in gain of the first-source-grounded amplifier.

A reception apparatus according to a third aspect of the present technology includes a single-phase differential conversion circuit that includes a first source-grounded amplifier and a second source-grounded amplifier. Each of the source-grounded amplifiers includes a transconductance amplifier section including a transistor for converting an AC component of input potential to a current, a diode load section including a transistor in a diode connection configured as a first load, and a large-signal distortion compensation circuit configured as a second load connected in parallel with the first load. The transistors of the first source-grounded amplifier are each a P-type MOS transistor. The transistors of the second source-grounded amplifier are each an N-type MOS transistor.

Thus according to the third aspect of the present technology, there are provided a first source-grounded amplifier and a second source-grounded amplifier. Each of the source-grounded amplifiers includes a transconductance amplifier section including a transistor for converting an AC component of input potential to a current, a diode load section including a transistor in a diode connection configured as a first load, and a large-signal distortion compensation circuit configured as a second load connected in parallel with the first load. The transistors of the first source-grounded amplifier are each a P-type MOS transistor. The transistors of the second source-grounded amplifier are each an N-type MOS transistor.

The single-phase differential conversion circuit may be either an independent apparatus or an internal block constituting part of a single apparatus.

Advantageous Effect of Invention

According to the first through the third aspects of the present technology, the linearity of input/output characteristics is improved.

Note that the advantageous effects outlined above are not limitative of the present disclosure. Further advantages will become apparent from a reading of the present disclosure.

BRIEF DESCRIPTION OF DRAWINGS

FIG. 5 is a graphic representation depicting results of comparison between the presence and absence of a large-signal distortion compensation circuit.

DESCRIPTION OF EMBODIMENTS

Described below are the preferred embodiments for practicing the present technology (called the embodiments hereinafter). Note that the description will be given under the following headings:
 1. Source-grounded amplifier circuit
 2. Single-phase differential conversion circuit
 3. Single-phase differential conversion circuit practiced through application of the present technology
 4. Reception apparatus practiced through application of the present technology <1. Source-Grounded Amplifier Circuit>

Figure 1:
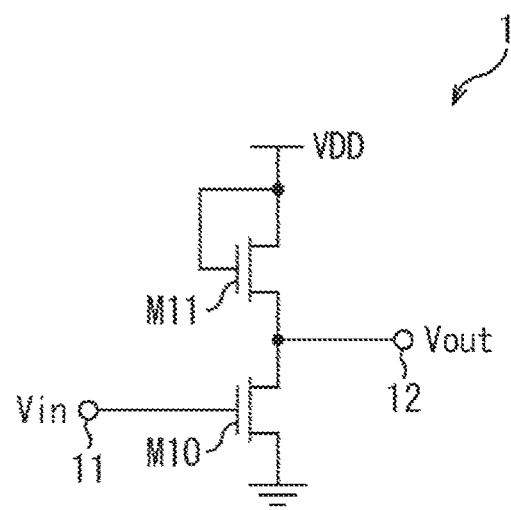
FIG. 1 is a circuit diagram depicting a source-grounded amplifier circuit that uses a diode load.

FIG. 1 depicts a source-grounded amplifier circuit that uses a diode load.

The source-grounded amplifier circuit 1 in FIG. 1 includes two transistors M10 and M11. The transistors M10 and M11 are each an N-type MOS (metal oxide semiconductor) transistor and have the same size.

The transistor M10 functions as a transconductance amplifier (also called the gm transistor hereinafter). The gate of the transistor M10 is connected with an input terminal 11 and is supplied with a signal of input potential Vin therefrom. The source of the transistor M10 is grounded on an AC basis, and the drain of the transistor M10 is connected with the source of the transistor M11.

The transistor M11 functions as a load (called the load transistor hereinafter). The gate and drain of the transistor M11 are connected with each other (a diode connection) and are connected with a power supply voltage VDD. The source of the transistor M11 is connected with the drain of the transistor M10. The potential at a connection point between the source of the transistor M11 and the drain of the transistor M10 is output as output potential Vout from an output terminal 12.

Figure 2:
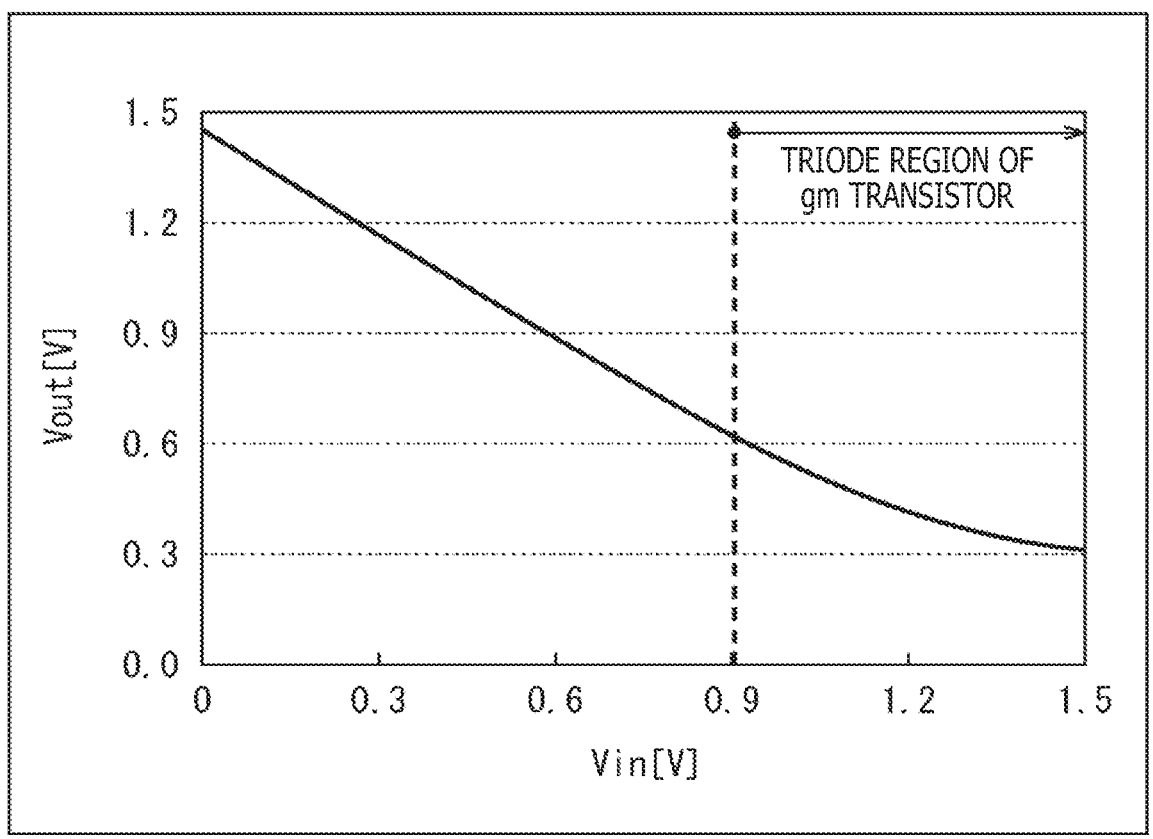
FIG. 2 is a graphic representation depicting changes in input potential Vin and output potential Vout noted in FIG. 1.

FIG. 2 depicts changes occurring in the potential Vout of a signal output from the output terminal 12 (output potential) when changes are made in the input potential Vin supplied to the input terminal 11 of the source-grounded amplifier circuit in FIG. 1.

In the source-grounded amplifier circuit 1, the transistor M10 as the gm transistor and the transistor M11 as the load transistor are made identical in size. For this reason, as depicted in FIG. 2, the gain involved remains constant with respect to the changes in the input and output potential in a range in which the transistor M10 satisfies saturation operation conditions, with the input/output characteristics rendered linear.

However, in the case where the input potential Vin becomes equal to or higher than a predetermined value (0.9 V in FIG. 2), the transistor M10 operates in a triode region. This lowers the gain and worsens the linearity of the input/output characteristics. Furthermore, given the input potential Vin approaching the triode region even in the range where the transistor M10 satisfies the saturation operation conditions, the gain starts to drop due to the effects of diverse nonideal characteristics of the transistor M10. This further reduces the range of the input potential Vin in which the linearity of the input/output characteristics is not adversely affected. The adverse effects worsen in the case where the power supply voltage VDD is reduced in order to implement low-power design.

<2. Single-Phase Differential Conversion Circuit>

Figure 3:
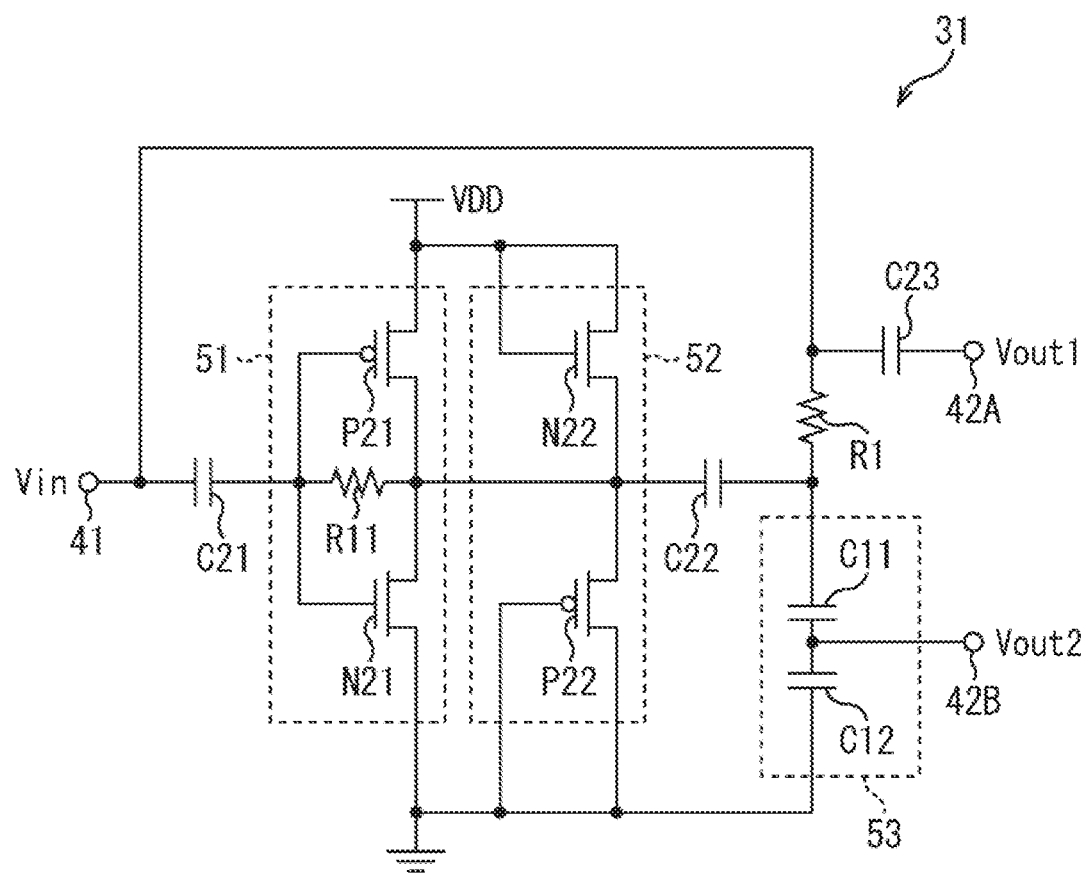
FIG. 3 is a circuit diagram depicting a single-phase differential conversion circuit that uses the source-grounded amplifier circuit in FIG. 1.

FIG. 3 depicts a single-phase differential conversion circuit that uses the source-grounded amplifier circuit in FIG. 1.

A single-phase differential conversion circuit 31 in FIG. 3 includes an input terminal 41, a first output terminal 42A, and a second output terminal 42B. A single-phase signal input through the input terminal 41 is converted to a differential signal that is out of phase by 180 degrees. The resulting differential signal is output from the first output terminal 42A and from the second output terminal 42B. For example, an RF signal received by an antenna is input to the input terminal 41. The differential signal output from the first and the second output terminals 42A and 42B is input to a differential amplifier, for example.

The single-phase differential conversion circuit 31 includes a transconductance amplifier section 51, a load section 52, a capacitance attenuator 53, a resistor R1, and AC-coupled capacitors C21 to C23.

The transconductance amplifier section 51 includes a transistor P21, a transistor N21, and a resistor R11. These components constitute an inverter amplifier of what is known as the CMOS (complementary MOS) type.

The transistor P21 is a P-type MOS transistor of which the gate is supplied with a signal of the input potential Vin via the AC-coupled capacitor C21. The drain of the transistor P21 is connected with the drain of the transistor N21. The source of the transistor P21 is supplied with the power supply voltage VDD. Also, the gate and drain of the transistor P21 are connected with each other via the resistor R11.

The transistor N21 is an N-type MOS transistor of which the gate is supplied with the signal of the input potential Vin via the AC-coupled capacitor C21. The drain of the transistor N21 is connected with the drain of the transistor P21. The source of the transistor N21 is grounded. Also, the gate and drain of the transistor N21 are connected with each other via the resistor R11.

One end of the resistor R11 is connected with the gates of the transistors P21 and N21. The other end of the resistor R11 is connected with the drains of the transistors P21 and N21. The resistor R11, inserted in the transconductance amplifier section 51 as a feedback resistor, establishes an operating point for the gates of the transistors P21 and N21. The resistor R11 removes the DC component from the input potential Vin, allowing the AC component of the input potential Vin to be applied to the gates of the transistors P21 and N21. Also, the resistor R11 also has the function of ensuring matching between the input impedance of the single-phase differential conversion circuit 31 and the impedance of the antenna.

The load section 52 includes a transistor N22, which is an N-type MOS transistor, and a transistor P22, which is a P-type MOS transistor.

The power supply voltage VDD is supplied to the gate and drain of the transistor N22. The source of the transistor N22 is connected with the source of the transistor P22. The gate and drain of the transistor P22 are connected with each other and are also grounded. The source of the transistor P22 is connected with the source of the transistor N22.

That is, the gains and drains of the transistors N22 and P22 are connected with one another (to form a so-called diode connection). These transistors function as the load for the transconductance amplifier section 51. The connection point at which the source of the transistor N22 and that of the transistor P22 are connected with each other is connected with the capacitance attenuator 53 and resistor R11 via the AC-coupled capacitor C22.

The capacitance attenuator 53 includes capacitors C11 and C12. One end of the capacitor C11 is connected with the sources of the transistors N22 and P22 via the AC-coupled capacitor C22 and with one end of the resistor R1. The other end of the capacitor C11 is connected with one end of the capacitor C12 and with the second output terminal 42B. One end of the capacitor C12 is connected with the other end of the capacitor C11 and with the second output terminal 42B. The other end of the capacitor C12 is grounded.

The capacitance attenuator 53 attenuates the amplitude of the signal input to one end of the capacitor C11 at a rate of the capacitance of the capacitor C11 to that of the capacitor C12. The capacitance attenuator 53 outputs the attenuated signal from the second output terminal 42B.

One end of the resistor R1 is connected with one end of the capacitor C11 and with the sources of the transistors N22 and P22 via the AC-coupled capacitor C22. The other end of the resistor R1 is connected with the input terminal 41 and with the first output terminal 42A via the AC-coupled capacitor C23. As with the resistor R11 in the transconductance amplifier section 51, the resistor R1 has the function of securing matching between the input impedance of the single-phase differential conversion circuit 31 and the impedance of the antenna.

In the single-phase differential conversion circuit 31 configured as described above, the signal input through the input terminal 41 is output unmodified from the first output terminal 42A. At the same time, the input signal is inverted by the transconductance amplifier section 51 before being attenuated by the capacitance attenuator 53. The attenuated signal is output from the second output terminal 42B.

The single-phase differential conversion circuit 31 improves even-ordered distortion characteristics through the matching of P-type and N-type circuit configurations of the source-grounded amplifier circuit 1 in FIG. 1. Also, the device noise of the amplified signal is attenuated by the capacitance attenuator 53.

It is to be noted, however, that the single-phase differential conversion circuit 31 is required at least to double the inversion gain involved in view of making impedance matching compatible with noise reduction. The sum gm1 of the transconductance gm of the transistor P21 and the transconductance gm of the transistor N21 (=gm(P21)+gm(N21)) is set to be larger than the sum gm2 of the transconductance gm of the transistor N22 and that of the transistor P22 (=gm(N22)+gm(P22)). Specifically, for example, where the transistors P21, N21, N22 and P22 have the same channel length, the channel width of the transistor P21 is set to be larger than the channel width of the transistor P22 while the channel width of the transistor N21 is set to be larger than the channel width of the transistor N22.

As a result, when the signal is input, the gate-to-source potential difference for the transistors N22 and P22 is not equal to the gate-to-source potential difference for the transistor N21 and P21. The gain varies in a manner dependent on the amplitude of the input signal. That is, the linearity of the input/output characteristics is limited.

<3. Single-Phase Differential Conversion Circuit Practiced Through Application of the Present Technology>

Explained below is a single-phase differential conversion circuit embodying the present technology to further improve the linearity of input/output characteristics.

Figure 4:
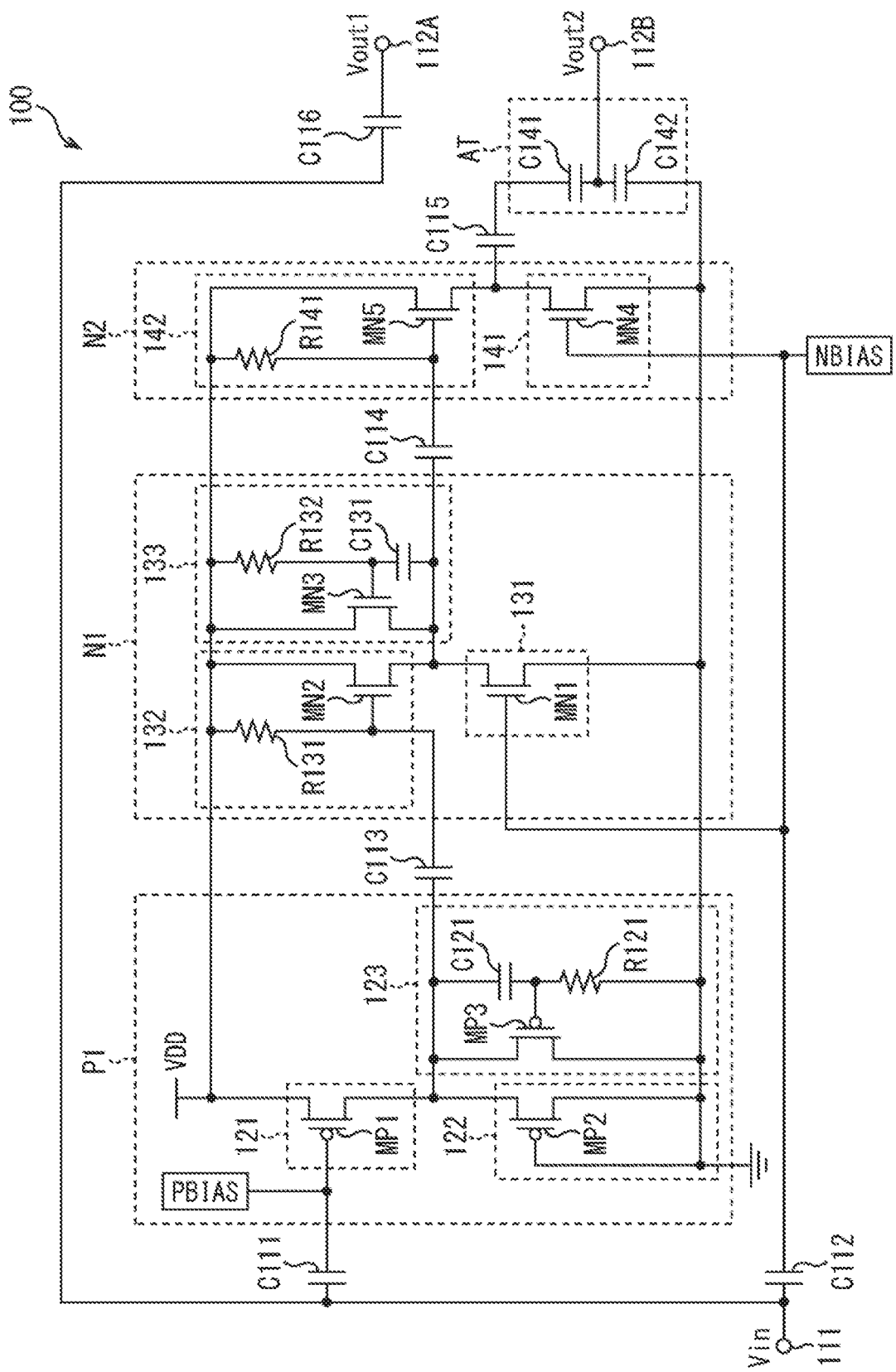
FIG. 4 is a circuit diagram depicting a single-phase differential conversion circuit practiced through application of the present technology.

FIG. 4 depicts a single-phase differential conversion circuit practiced through application of the present technology.

A single-phase differential conversion circuit 100 in FIG. 4 includes an input terminal 111, a first output terminal 112A, and a second output terminal 112B. A single-phase signal having the input potential Vin and input through the input terminal 111 is converted to a differential signal that is output from the first output terminal 112A and from the second output terminal 112B. The signal output from the first output terminal 112A has output potential Vout1, and the signal output from the second output terminal 112B has output potential Vout2.

The single-phase differential conversion circuit 100 includes an amplification stage P1, an amplification stage N1, an amplification stage N2, a capacitance attenuator (capacitance voltage divider) AT, and AC-coupled capacitors (capacitive elements) C111 to C116.

The signal input to the single-phase differential conversion circuit 100 through the input terminal 111 is output unmodified to the outside from the first output terminal 112A via the AC-coupled capacitor C116. Also, the signal input through the input terminal 111 is inversely amplified by the amplification stages P1, N1 and N2. The inversely amplified signal is then subjected to gain adjustment by the capacitance attenuator AT before being output to the outside from the second output terminal 112B. As a result, the single-phase differential conversion circuit 100 converts a single-phase signal to a differential signal that is output.

The signal input to the single-phase differential conversion circuit 100 through the input terminal 111 is supplied to each of the amplification stages P1, N1 and N2 via a single AC-coupled capacitor. Specifically, the signal input to the single-phase differential conversion circuit 100 is input to the amplification stage P1 via the AC-coupled capacitor C111. The signal input to the single-phase differential conversion circuit 100 is input to the amplification stages N1 and N2 via the AC-coupled capacitor C112.

Also, the output of the amplification stage P1 is input to the amplification stage N1 via the AC-coupled capacitor C113. The output of the amplification stage N1 is input to the amplification stage N2 via the AC-coupled capacitor C114. The output of the amplification stage N2 is input to the capacitance attenuator AT via the AC-coupled capacitor C115.

(Amplification Stage P1)

The amplification stage P1 is a source-grounded amplifier including a transconductance amplifier section 121 that converts the AC component of the input potential Vin to a current, a diode load section 122 that acts as a first load, and a large-signal distortion compensation circuit 123 connected in parallel with the first load and acting as a second load.

The transconductance amplifier section 121 includes a transistor MP1. The diode load section 122 includes a transistor MP2. The large-signal distortion compensation circuit 123 includes a transistor MP3, a resistor (resistive element) R121, and an AC-coupled capacitor C121. The transistors MP1 to MP3 are each a P-type MOS transistor.

The gate of the transistor MP1 is supplied with a signal in which the AC component of the input potential Vin is superimposed on a bias voltage PBIAS. The source of the transistor MP1 is connected with the power source voltage VDD. The drain of the transistor MP1 is connected with the sources of the transistors MP2 and MP3.

The source of the transistor MP2 is connected with the drain of the transistor MP1 and with the source of the transistor MP3. The gate and drain of the transistor MP2 form a diode connection and are grounded.

The gate and source of the transistor MP3 are connected with each other via the AC-coupled capacitor C121. The gate and drain of the transistor MP3 are connected with each other via the resistor R121. The gates and drains of the transistors MP2 and MP3 are at the same DC potential.

The amplification stage P1 inversely amplifies the signal input via the AC-coupled capacitor C111. The inversely amplified signal is output to the amplification stage N1 via the AC-coupled capacitor C113.

(Amplification Stage N1)

The amplification stage N1 is a source-grounded amplifier including a transconductance amplifier section 131 that converts the AC component of the input potential Vin to a current, a diode load section 132 that acts as a first load, and a large-signal distortion compensation circuit 133 connected in parallel with the first load and acting as a second load.

The transconductance amplifier section 131 includes a transistor MN1. The diode load section 132 includes a transistor MN2 and a resistor R131. The large-signal distortion compensation circuit 133 includes a transistor MN3, a resistor (resistive element) R132, and an AC-coupled capacitor C131. The transistors MN1 to MN3 are each an N-type MOS transistor.

The gate of the transistor MN1 is supplied with a signal in which the AC component of the input potential Vin is superimposed on a bias voltage NBIAS. The source of the transistor MN1 is grounded. The drain of the transistor MN1 is connected with the sources of the transistors MN2 and MP3.

The gate of the transistor MN2 is supplied with the output of the amplification stage P1 via the AC-coupled capacitor C113. The source of the transistor MN2 is connected with the drain of the transistor MN1 and with the source of the transistor MN3, and constitutes the output of the amplification stage N1. The gate and drain of the transistor MN2 form a diode connection via the resistor R131. The drain of the transistor MN2 is connected with the power supply voltage VDD.

The gate and source of the transistor MN3 are connected with each other via the AC-coupled capacitor C131. The gate and drain of the transistor MN3 are connected with each other via the resistor R132. The gates and drains of the transistors MN2 and MN3 are at the same DC potential. The drain of the transistor MN3 is connected with the power supply voltage VDD.

The amplification stage N1 outputs a signal associated with two signals: the signal input to the gate of the transistor MN2 from the amplification stage P1 via the AC-coupled capacitor C113, and the signal input through the input terminal 111 via the AC-coupled capacitor C112. Before being output, the two input signals s are each subject to amplification by the amplification stage N1 acting as an amplifier with a certain gain.

Thus the amplification stage N1 amplifies a signal obtained by adding up the two input signals and adding a predetermined weight to the sum, and outputs the amplified signal to the amplification stage N2 via the AC-coupled capacitor C114.

(Amplification Stage N2)

The amplification stage N2 is a source-grounded amplifier including a transconductance amplifier section 141 that converts the AC component of the input potential Vin to a current, and a diode load section 142.

The transconductance amplifier section 141 includes a transistor MN4. The diode load section 142 includes a transistor MN5 and a resistor R141. The transistors MN4 and MN5 are each an N-type MOS transistor.

The gate of the transistor MN4 is supplied with a signal in which the AC component of the input potential Vin is superimposed on a bias voltage NBIAS. The source of the transistor MN4 is grounded. The drain of the transistor MN4 is connected with the source of the transistor MN5.

The gate of the transistor MN5 is supplied with the output of the amplification stage N1 via the AC-coupled capacitor C114. The source of the transistor MN5 is connected with the drain of the transistor MN4, and constitutes the output of the amplification stage N2. The gate and drain of the transistor MN5 form a diode connection via the resistor R141. The drain of the transistor MN5 is connected with the power supply voltage VDD.

The amplification stage N2 outputs a signal associated with two signals: the signal input to the gate of the transistor MN5 from the amplification stage N1, and the signal input through the input terminal 111 via the AC-coupled capacitor C112. Before being output, the two input signals are each subject to amplification by the amplification stage N2 acting as an amplifier with a certain gain.

Thus the amplification stage N2 amplifies a signal obtained by adding up the two input signals and adding a predetermined weight to the sum, and outputs the amplified signal to the capacitance attenuator AT via the AC-coupled capacitor C115.

In the amplification stages P1, N1 and N2 configured as described above, each of the signal paths from the input terminal 111 to the output of the amplification stage N2 includes only one source-grounded circuit. This causes the output of the amplification stage N2 to be an inversely amplified signal of the input signal. The amplification stages P1, N1 and N2 are designed in such a manner that the inversion gain acquired thereby is multiplied by a factor of at least one.

(Capacitance Attenuator AT)

The capacitance attenuator AT includes serially connected capacitors (capacitive elements) C141 and C142 constituting an attenuation section that attenuates the amplitude of the signal output from the amplification stage N2. One end of the capacitor C141 is connected with the drain of the transistor MN4 and with the source of the transistor MN5 in the amplification stage N2 via the AC-coupled capacitor C115. The other end of the capacitor C141 is connected with one end of the capacitor C142 and with the second output terminal 112B. One end of the capacitor C142 is connected with the other end of the capacitor C141 and with the second output terminal 112B. The other end of the capacitor C142 is grounded.

The capacitance attenuator AT attenuates the amplitude of the signal input to one end of the capacitor C141 at a rate of the capacitance of the capacitor C141 to that of the capacitor C142. The attenuated signal is fed to the second output terminal 112B before being output to the outside.

Generally, when the differential symmetry of the signal applied to the input of a differential amplifier is impaired, even-ordered distortion develops in the differential amplifier. Therefore, it is desired that the input of the differential amplifier be impressed with the input having the best differential symmetry possible. By use of the capacitance attenuator AT connected with the second output terminal 112B, the single-phase differential conversion circuit 100 may adjust the amplitude of the output signal from the amplification stage N2 in such a manner as to improve differential symmetry.

(Operation of the Large-Signal Distortion Compensation Circuit)

The operation of the large-signal distortion compensation circuit 133 in the amplification stage N1, for example, is explained below. Note that the principle of operation is the same as for the large-signal distortion compensation circuit 123 in the amplification stage P1.

The gate and drain of the transistor MN3 are connected with each other via the resistor R132. Because the gate side has no element that would generate a DC current, the gate and drain are serially short-circuited and are at the same potential. The transistor MN3 thus forms a diode connection on a DC basis.

However, with the AC-coupled capacitor C131 connected interposingly between the gate and source of the transistor MN3, the transistor MN3 operates in a manner not generating an AC potential difference between the gate and the source at high frequencies. Therefore, the drain current of the transistor MN3 remains constant at high frequencies. The transistor MN3 is thus regarded as a current source.

Explained below is how the gain is determined in consideration of the operation of the large-signal distortion compensation circuit 133 with respect to the amplification stage N1.

It is assumed that the currents flowing through the transistors MN1, MN2 and MN3 are noted as $I_1$, $I_2$ and $I_3$ respectively. It is also assumed that the current factors of the transistors MN1, MN2 and MN3 are referred to as $\beta_1$, $\beta_2$ and $\beta_3$, respectively.

First, in the case where the frequency is so low that the large-signal distortion compensation circuit 133 is considered a diode load, the gain Av of the large-signal distortion compensation circuit 133 may be defined by the following mathematical expression (1):

[Math 1]

$$Av = -\frac{\sqrt{2I_1\beta_1}}{\sqrt{2I_2\beta_2} + \sqrt{2I_3\beta_3}} \qquad (1)$$

In the above expression, the currents $I_2$ and $I_3$ are obtained by shunting the current $I_1$ at a size rate of the respective transistors, which provides the following mathematical expression:

[Math 2]

$$I_2 = I_1 \frac{\beta_2}{\beta_2 + \beta_3}$$

$$I_3 = I_1 \frac{\beta_3}{\beta_2 + \beta_3}$$

Substituting the currents $I_2$ and $I_3$ into the above expression (1) reduces and eliminates the current $I_1$. This clearly indicates that the gain Av is not dependent on the bias current.

However, it is necessary to consider instantaneous currents with regard to high-frequency signals. Whereas the large-signal distortion compensation circuit 133 is regarded as a diode load at low frequencies, the large-signal distortion compensation circuit 133 operates as a current source load at high frequencies because the source and the gate operate in a coordinated manner while maintaining a constant potential difference therebetween under the high-pass filter effect of the capacitor and the resistor.

Thus if it is assumed that a current including an instantaneous high-frequency current $\Delta I$ ($I_1 + \Delta I$) flows to the transistor MN1, the instantaneous high-frequency current $\Delta I$ does not flow to the transistor NM3 and therefore flows in its entirety into the transistor NM2.

As a result, the gain Av in consideration of the instantaneous high-frequency current $\Delta I$ is defied by the following mathematical expression (2):

[Math 3]

$$Av = -\frac{\sqrt{2(I_1 + \Delta I)\beta_1}}{\sqrt{2(I_2 + \Delta I)\beta_2}} \qquad (2)$$

Differentiating the expression (2) provides the following mathematical expression (3):

[Math. 4]

$$\frac{\partial Av}{\partial \Delta I} = \frac{\beta_1\beta_2(I_2 + \Delta I) - \beta_1\beta_2(I_1 + \Delta I)}{[(I_2 + \Delta I)\beta_2]^2} \qquad (3)$$

$$= \frac{\beta_1\beta_2(I_2 - I_1)}{[(I_2 + \Delta I)\beta_2]^2}$$

Since the current $I_2$ is obtained by shunting the current $I_1$, the numerator in the expression (3) is a negative value. The gain is thus negatively dependent on $\Delta I$. That is, when the current $I_1$ is instantaneously reduced, the gain Av of the large-signal distortion compensation circuit 133 increases.

Based on the above, what follows is an explanation of how the single-phase differential conversion circuit 100 operates when a large signal is input.

First, when the gate potential of the transistor MP1 in the amplification stage P1 leading to the input terminal 111 of the single-phase differential conversion circuit 100 is momentarily brought significantly lower than DC operating potential, the transistor MP1 plunges into a triode region and drops in transconductance. This causes the amplification stage P1 to lower its gain.

At that point, in the amplification stage N1, the gate potential of the transistor MN1 also leading to the input terminal 111 of the single-phase differential conversion circuit 100 is likewise brought significantly lower than the potential at a DC operating point. Thus the drain current of the transistor MN1 in the amplification stage N1 becomes smaller than the drain current value at the DC operating point. In turn, the mechanism of the above expression (3) causes the gain of the amplification stage N1 to become higher than the value at the DC operating point.

As a result, the output of the amplification stage P1 of which the gain has dropped is supplemented with the output of the amplification stage N1 whose gain has increased. This compensates for the drop in the gain.

Conversely, when the gate potential of the transistor MP1 in the amplification stage P1 is momentarily brought significantly higher than the DC operating potential, the transistor MN1 of the amplification stage N1 plunges into a triode region and drops in transconductance. This causes the amplification stage N1 to lower its gain. In this case, the amplification stage P1 compensates for the drop in the gain of the amplification stage N1.

Eventually, the amplification stages N1 and P1 operate to compensate for the drop in their gain in a complementary manner.

FIG. 5 depicts the results of comparison between the presence and absence of a large-signal distortion compensation circuit in terms of changes in the gain with respect to variations in the input potential Vin at high frequencies.

In each of two graphs in FIG. 5, the horizontal axis denotes variations [V] at high frequencies in the input potential Vin from a DC operating point, and the vertical axis represents gain [mag]. In the case where the large-signal distortion compensation circuit is absent as indicated in the left-side graph in FIG. 5, the gain changes slightly as the variations become larger at high frequencies. By contrast, where the large-signal distortion compensation circuit is present as depicted in the right-side graph in FIG. 5, the gain is kept constant.

As a result, the large-signal distortion compensation circuit 123 in the amplification stage P1 and the large-signal distortion compensation circuit 133 in the amplification stage N1 compensate for linearity in a complementary manner. It is thus possible to reduce distortion over a wide input range.

The above-described single-phase differential conversion circuit 100 ensures the voltage gain by adding up the output signals from the amplification stages P1, N1 and N2. Furthermore, the single-phase differential conversion circuit 100 uses the large-signal distortion compensation circuits 123 and 133 to compensate, in complementary fashion, for the distortion caused by the amplification stages P1 and N1. As a result, this improves the linearity of the input/output characteristics.

<4. Reception Apparatus Practiced Through Application of the Present Technology>

Figure 6:
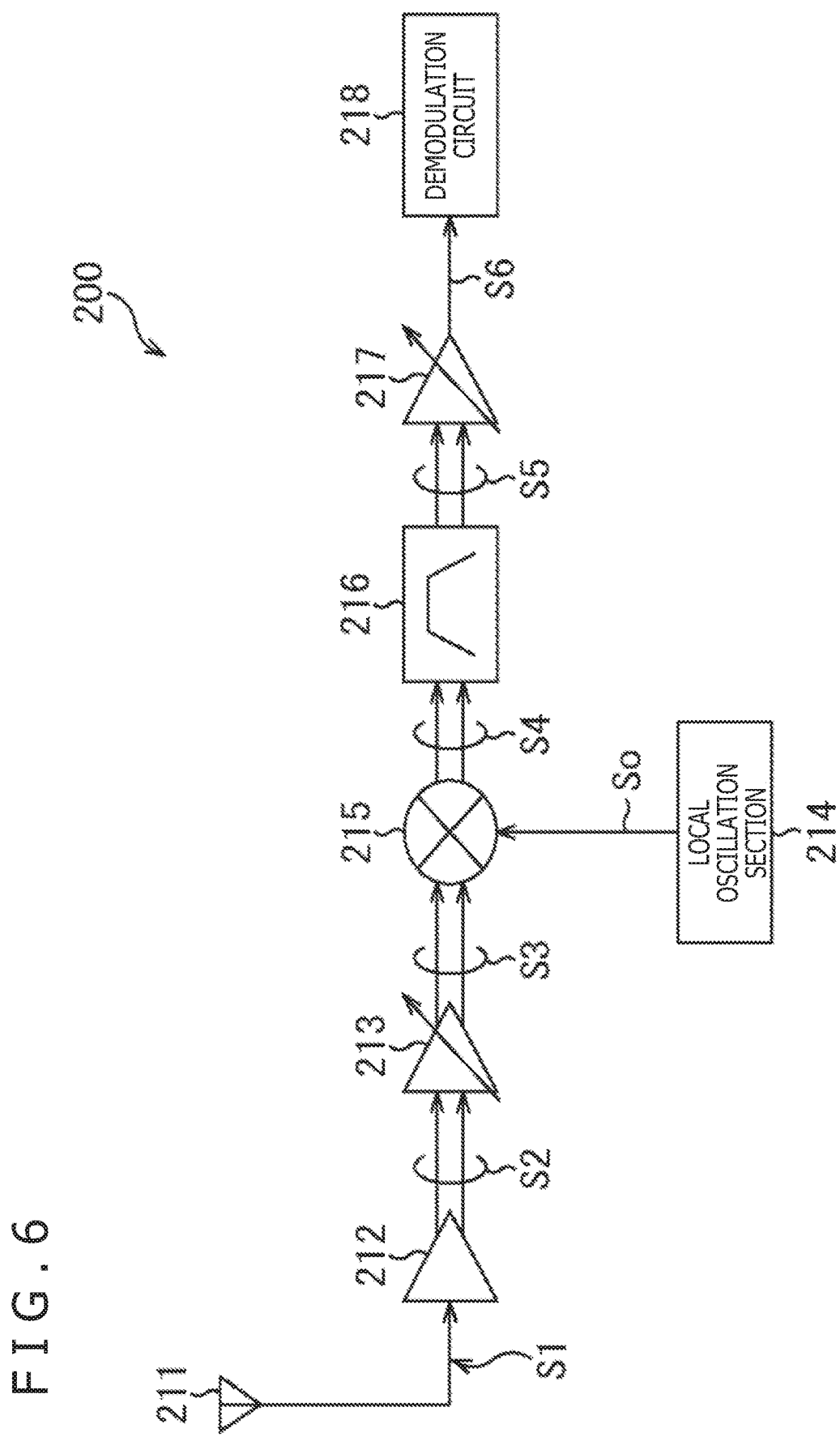
FIG. 6 is a schematic diagram depicting a reception apparatus practiced through application of the present technology.

FIG. 6 depicts a reception apparatus practiced through application of the present technology.

(Configuration of the Reception Apparatus)

A reception apparatus 200 in FIG. 6 is, for example, an apparatus that receives TV signals and includes an antenna 211, a single-phase differential conversion circuit 212, an RF amplifier 213, a local oscillation section 214, a mixer 215, a filter 216, an IF amplifier 217, and a demodulation circuit 218.

The single-phase differential conversion circuit 212 converts a signal S1 (single-phase signal) supplied from the antenna 211 to a differential signal that is output as a signal S2.

The RF amplifier 213 is a variable gain amplifier that amplifies the signal S2 supplied from the single-phase differential conversion circuit 212 and outputs the amplified signal as a signal S3. Specifically, the RF amplifier 213 adjusts the gain in accordance with the differential amplitude of the signal S2 supplied from the single-phase differential conversion circuit 212 in such a manner as to keep the differential amplitude of the signal S3 within a predetermined amplitude range. As a result, this makes it possible, where there is large differential amplitude of the signal S2 fed from the single-phase differential conversion circuit 212, for example, to keep the differential amplitude of the signal S3 within a predetermined amplitude range in order the suppress the effects of so-called interfering waves. Furthermore, the RF amplifier 213 is configured to suppress noise generation, which in turn lowers the noise figure (NF) of the entire reception apparatus 200.

The local oscillation section 214 is an oscillation circuit that generates a signal So having a frequency different from that of the wireless communication carrier by the amount of IF frequency. For example, the local oscillation section 214 is configured with a frequency synthesizer that uses a PLL (phase-locked loop).

The mixer 215 multiplies the signal S3 from the RF amplifier 213 by the signal So from the local oscillation section 214 for down-conversion. In so doing, the mixer 215 extracts the signal component superimposed on the carrier and outputs what is extracted as a signal S4.

The filter 216 is a band-pass filter that generates a signal S5 by ridding the signal S4 output from the mixer 215 of undesired frequency components generated at the time the mixer 215 multiplies the signal S3 by the signal S5.

The IF amplifier 217 is a variable gain amplifier that amplifies the signal supplied from the filter 216 and outputs the amplified signal as a signal S6. Specifically, as with the RF amplifier 213, the IF amplifier 217 adjusts the gain in accordance with the differential amplitude of the signal S5 supplied from the filter 216 in such a manner as to keep the amplitude of the signal S6 within a predetermined amplitude range. As a result, this makes it possible, even when the differential amplitude of the signal S5 is small, to make the amplitude of the signal S6 sufficient for the downstream modulation circuit 218 to operate.

The demodulation circuit 218 performs demodulation processing based on the signal S6 supplied from the IF amplifier 217.

(Operation of the Reception Apparatus)

The operation of the entire reception apparatus 200 is explained below.

The single-phase differential conversion circuit 212 converts the signal S1 (single-phase signal) supplied from the antenna 211 into a differential signal and outputs the differential signal as the signal S2. The RF amplifier 213 amplifies the signal S2 supplied from the single-phase differential conversion circuit 212 and outputs the amplified signal as the signal S3. The local oscillation section 214 generates the signal So having a frequency different from that of the wireless communication carrier by the amount of IF frequency, and supplies the generated signal So to the mixer 215. The mixer 215 multiplies the signal S3 from the RF amplifier 213 by the signal So from the location oscillation section 214 for down-conversion, thereby generating the signal S4 for output to the filter 216. The filter 216 removes undesired frequency components from the signal S4 output from the mixer 215 so as to generate the signal S5 for output to the IF amplifier 217. The IF amplifier 217 amplifies the signal S5 supplied from the filter 216 and outputs the amplified signal as the signal S6. The demodulation circuit 218 performs demodulation processing on the basis of the signal S6 supplied from the IF amplifier 217.

(Configuration of the Single-Phase Differential Conversion Circuit)

Figure 7:
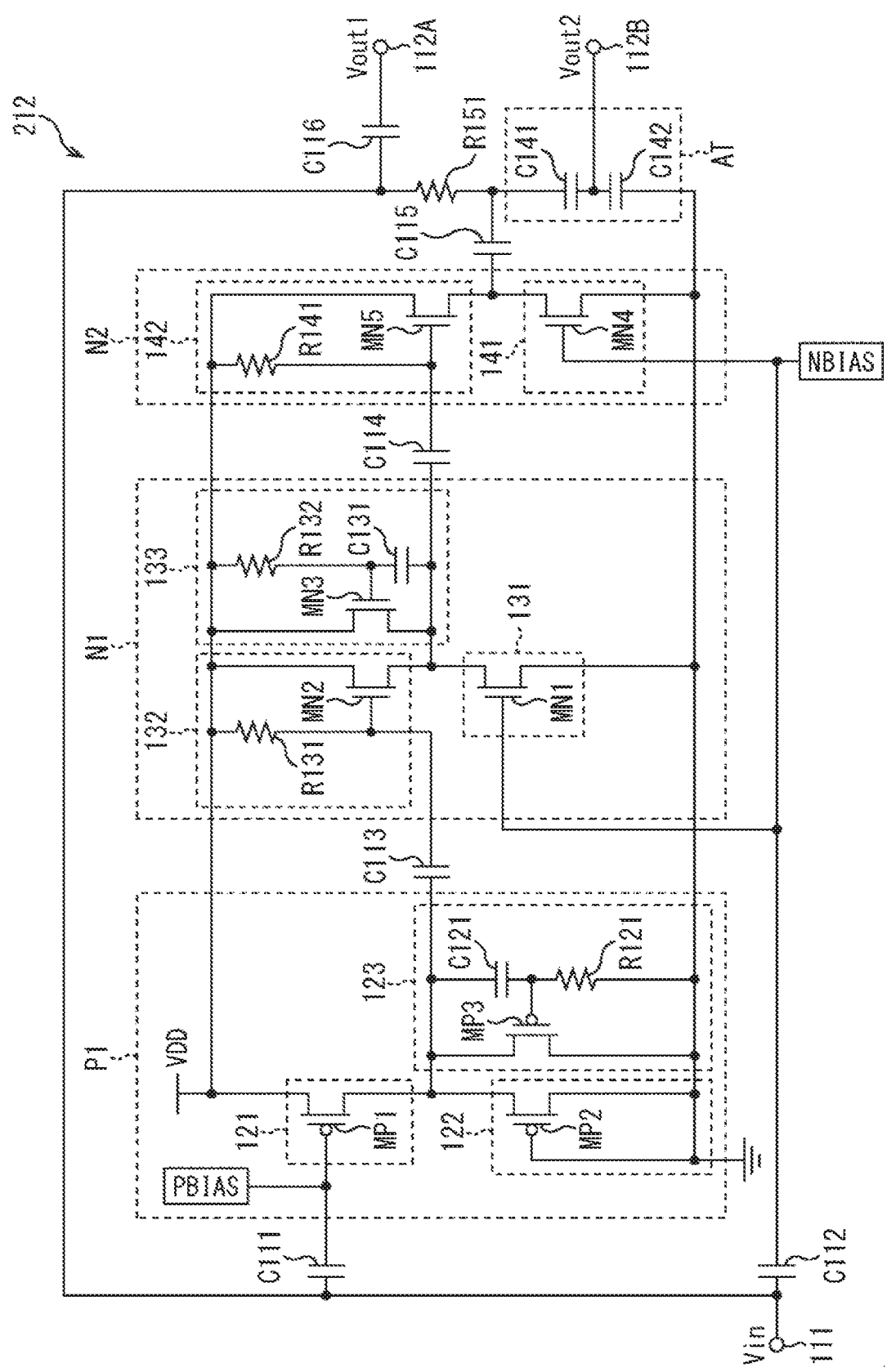
FIG. 7 is a circuit diagram depicting a typical detailed configuration of a single-phase differential conversion circuit in the reception apparatus in FIG. 6.

FIG. 7 depicts a typical detailed configuration of the single-phase differential conversion circuit 212 in FIG. 6.

In FIG. 7, the components common to those in the single-phase differential conversion circuit 100 in FIG. 4 are designated by the same reference signs. These components are not described further.

The single-phase differential conversion circuit 212 in FIG. 7 differs in comparison from the single-phase differential conversion circuit 100 in FIG. 4 in that a resistor R151 is interposed anew between the AC-coupled capacitor C116 connected with the first output terminal 112A and the capacitor C141 constituting the capacitance attenuator AT. The rest of the configuration of the single-phase differential conversion circuit 212 is similar to that of the single-phase differential conversion circuit 100.

One end of the resistor R151 is connected with the input terminal 111 and with the other end of the AC-coupled capacitor C116 not on the side of the first output terminal 112A. The other end of the resistor R151 is connected with the other end of the AC-coupled capacitor C115 not on the side of the drain of the transistor MN4 and the source of the transistor MN5 in the amplification stage N2, and with the other end of the capacitor C141 in the capacitance attenuator AT not on the side of the capacitor C142.

The signal S1 (RF signal) from the antenna 211 is input to the input terminal 111 of the single-phase differential conversion circuit 212. A differential signal generated by the single-phase differential conversion circuit 212 is output as the signal S2 from the first output terminal 112A and from the second output terminal 112B.

The resistor R151 has the function of ensuring impedance matching with the impedance of the antenna 211. Also, the resistor R151 provides a resistor feedback from the output side to the input side to further improve input/output characteristics.

The device noise generated by the amplification stages P1, N1 and N2 is output via the resistor R151 or via the capacitor C141 to the first output terminal 112A and to the second output terminal 112B as an in-phase component. The capacitance attenuator AT attenuates the voltage amplitude of the device noise in such a manner as to equalize the voltage amplitude of the device noise from these amplification stages.

Thus the single-phase differential conversion circuit 212 adds up the output signals from the amplification stages P1, N1 and N2 to ensure voltage gain. The single-phase differential conversion circuit 212 further reduces the device noise generated in the amplification process in such a manner as to make impedance matching compatible with noise reduction.

Also, in the entire reception apparatus 200, the ability to remove in-phase signals provided by the RF amplifier 213 downstream of the single-phase differential conversion circuit 212 cancels the device noise generated by the amplification stages P1, N1 and N2. As a result, both the reduction of the device noise and the suppression of even-ordered distortion generation are implemented at the same time.

Figure 8:
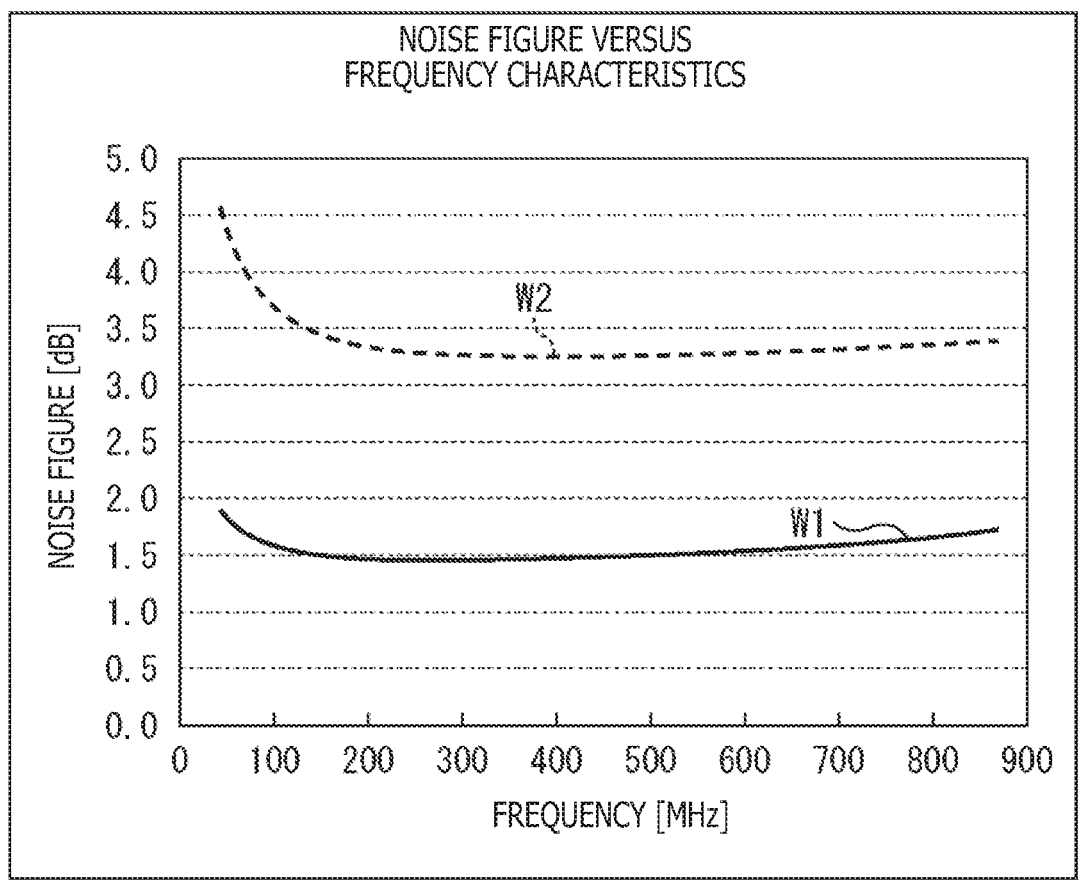
FIG. 8 is a graphic representation plotting noise figures of a single-end signal and a differential signal at different frequencies.

FIG. 8 plots noise figures at different frequencies of a single-end signal and a differential signal output from the single-phase differential conversion circuit 212.

In FIG. 8, a plot W1 indicates the noise figure of the differential signal output from the single-phase differential conversion circuit 212, and a plot W2 represents the noise figure of the single-end signal output from the single-phase differential conversion circuit 212.

As depicted in FIG. 8, the differential signal has its device noise canceled out and is thereby improved in noise figure characteristics.

As described above, the present technology improves resistance to interfering waves by achieving low noise figures, high linearity, and wideband impedance matching. The present technology thus provides a reception apparatus capable of making effective use of radio bands.

It is possible to eliminate any undesired wave removing filter, balun, or low-noise amplifier external to an IC chip (receiving IC) that includes the single-phase differential conversion circuit 212. Such reduction in the number of components lowers the cost of reception modules.

Because the single-phase differential conversion circuit 212 converts the single-phase signal fed from the antenna 211 to a differential signal with low distortion and with low noise, it is possible to ease up on the linearity and noise performance required of the group of circuits downstream of the single-phase differential conversion circuit 212. As a result, this improves reception performance while minimizing any increase in the power consumption of the receiving IC.

The embodiments of the present technology are not limited to those discussed above and may be modified or altered diversely within the scope of this technology.

In the above-described single-phase differential conversion circuit 100, the amplification stages P1 and N1 may be switched in sequence. That is, the output of the amplification stage N1 may be configured to be input to the amplification stage P1. Also, whereas the amplification stage downstream of the amplification stages P1 and N1 is configured with a source-grounded amplifier using an N-type MOS transistor, the downstream amplification stage may be configured alternatively with a source-grounded amplifier using a P-type MOS transistor. The same also applies to the single-phase differential conversion circuit 212.

For example, part or all of the multiple embodiments discussed above may be combined suitably to devise other embodiments.

Note that the advantageous effects stated in this description are only examples and not limitative of the present technology that may also provide other advantages.

Note that the present disclosure may be implemented preferably in the following configurations:

(1)

A single-phase differential conversion circuit including: a first source-grounded amplifier and a second source-grounded amplifier, each of the source-grounded amplifiers including a transconductance amplifier section including a transistor for converting an AC component of input potential to a current, a diode load section including a transistor in a diode connection configured as a first load, and a large-signal distortion compensation circuit configured as a second load connected in parallel with the first load, in which the transistors of the first source-grounded amplifier are each a P-type MOS transistor, and the transistors of the second source-grounded amplifier are each an N-type MOS transistor.

(2)

The single-phase differential conversion circuit as stated in paragraph (1) above, in which the large-signal distortion compensation circuit includes a transistor, a resistive element, and a capacitive element.

(3)

The single-phase differential conversion circuit as stated in paragraph (2) above, in which the gate and the source of the transistor in the large-signal distortion compensation circuit are connected with each other via the capacitive element, and the gate and the drain of the transistor in the large-signal distortion compensation circuit are connected with each other via the resistive element.

(4)

The single-phase differential conversion circuit as stated in any one of paragraphs (1) to (3) above, in which the output of the first source-grounded amplifier is input to the diode load section of the second source-grounded amplifier.

(5)

The single-phase differential conversion circuit as stated in any one of paragraphs (1) to (4) above, further including:

a third source-grounded amplifier including a transconductance amplifier section including a transistor for converting the AC component of the input potential to a current, and a diode load section including a transistor in a diode connection, in which the output of the second source-grounded amplifier is input to the diode load section of the third source-grounded amplifier.

(6)

The single-phase differential conversion circuit as stated in paragraph (5) above, in which the transistors of the third source-grounded amplifier are each an N-type MOS transistor.

(7)

The single-phase differential conversion circuit as stated in paragraph (5) above, further including:

an attenuation section configured to attenuate the amplitude of a signal output from the third source-grounded amplifier.

(8)

The single-phase differential conversion circuit as stated in paragraph (7) above, in which the attenuation section includes two serially connected capacitive elements.

(9)

The single-phase differential conversion circuit as stated in paragraph (7) or (8) above, further including:

a first output terminal and a second output terminal configured to output a differential signal, in which the first output terminal outputs a signal input to an input terminal, and the second output terminal outputs the output of the attenuation section.

(10)

The single-phase differential conversion circuit as stated in any one of paragraphs (1) to (9) above, in which a signal received by an antenna is input as an input signal, and a resistive element is further included to ensure matching between the impedance of the antenna and the impedance of the single-phase differential conversion circuit.

(11)

A signal processing method for use with a single-phase differential conversion circuit including a first source-grounded amplifier and a second source-grounded amplifier, each of the source-grounded amplifiers including a transconductance amplifier section including a transistor for converting an AC component of input potential to a current, a diode load section including a transistor in a diode connection configured as a first load, and a large-signal distortion compensation circuit configured as a second load connected in parallel with the first load, the transistors of the first source-grounded amplifier being each a P-type MOS transistor, the transistors of the second source-grounded amplifier being each an N-type MOS transistor, the signal processing method including:

causing the first source-grounded amplifier to compensate for a drop in gain of the second source-grounded amplifier; and causing the second source-grounded amplifier to compensate for a drop in gain of the first-source-grounded amplifier.

(12)

A reception apparatus including:

a single-phase differential conversion circuit that includes a first source-grounded amplifier and a second source-grounded amplifier, each of the source-grounded amplifiers including a transconductance amplifier section including a transistor for converting an AC component of input potential to a current, a diode load section including a transistor in a diode connection configured as a first load, and a large-signal distortion compensation circuit configured as a second load connected in parallel with the first load, in which the transistors of the first source-grounded amplifier are each a P-type MOS transistor, and the transistors of the second source-grounded amplifier are each an N-type MOS transistor.

REFERENCE SIGNS LIST

100 Single-phase differential conversion circuit, 111 Input terminal, 112A First output terminal, 112B Second output terminal, P1 Amplification stage, N1, N2 Amplification stage, AT Capacitance attenuator, C111 to C116 AC-coupled capacitor, 121 Transconductance amplifier section, 122 Diode load section, 123 Large-signal distortion compensation circuit, 131 Transconductance amplifier section, 132 Diode load section, 133 Large-signal distortion compensation circuit, 200 Reception apparatus, 212 Single-phase differential conversion circuit, R151 Resistor

The invention claimed is:

1. A single-phase differential conversion circuit, comprising:
a first source-grounded amplifier and a second source-grounded amplifier, wherein
each of the first source-grounded amplifier and the second source-grounded amplifier including:
a transconductance amplifier section including a transistor for converting an AC component of input potential to a current,
a diode load section including a transistor in a diode connection configured as a first load, and
a large-signal distortion compensation circuit configured as a second load connected in parallel with the first load,
each transistor of the first source-grounded amplifier is a P-type MOS transistor, and
each transistor of the second source-grounded amplifier is an N-type MOS transistor.

2. The single-phase differential conversion circuit according to claim 1, wherein the large-signal distortion compensation circuit includes a transistor, a resistive element, and a capacitive element.

3. The single-phase differential conversion circuit according to claim 2, wherein
a gate and a source of the transistor in the large-signal distortion compensation circuit are connected with each other via the capacitive element, and
the gate and a drain of the transistor in the large-signal distortion compensation circuit are connected with each other via the resistive element.

4. The single-phase differential conversion circuit according to claim 1, wherein an output of the first source-grounded amplifier is an input for the diode load section of the second source-grounded amplifier.

5. The single-phase differential conversion circuit according to claim 1, further comprising a third source-grounded amplifier including:
a transconductance amplifier section including a transistor for converting the AC component of the input potential to the current, and
a diode load section including a transistor in a diode connection, wherein
an output of the second source-grounded amplifier is input for the diode load section of the third source-grounded amplifier.

6. The single-phase differential conversion circuit according to claim 5, wherein each transistor of the third source-grounded amplifier is the N-type MOS transistor.

7. The single-phase differential conversion circuit according to claim 5, further comprising an attenuation section configured to attenuate an amplitude of a signal outputted from the third source-grounded amplifier.

8. The single-phase differential conversion circuit according to claim 7, wherein the attenuation section includes two serially connected capacitive elements.

9. The single-phase differential conversion circuit according to claim 7, further comprising a first output terminal and a second output terminal configured to output a differential signal, wherein
the first output terminal is configured to output a signal input to an input terminal of the single-phase differential conversion circuit, and
the second output terminal is configured to output an output of the attenuation section.

10. The single-phase differential conversion circuit according to claim 1, further comprising a resistor, wherein
a signal received by an antenna is input as an input signal, and
the resistor is configured to ensure matching between an impedance of the antenna and an impedance of the single-phase differential conversion circuit.

11. A signal processing method, comprising:
in a single-phase differential conversion circuit including:
a first source-grounded amplifier and a second source-grounded amplifier, wherein
each of the first source-grounded amplifier and the second source-grounded amplifier including:
a transconductance amplifier section including a transistor for converting an AC component of input potential to a current,
a diode load section including a transistor in a diode connection configured as a first load, and
a large-signal distortion compensation circuit configured as a second load connected in parallel with the first load,
each transistor of the first source-grounded amplifier is a P-type MOS transistor, and
each transistor of the second source-grounded amplifier is an N-type MOS transistor
causing the first source-grounded amplifier to compensate for a drop in gain of the second source-grounded amplifier; and
causing the second source-grounded amplifier to compensate for a drop in gain of the first-source grounded amplifier.

12. A reception apparatus, comprising:
a single-phase differential conversion circuit that includes
a first source-grounded amplifier and a second source-grounded amplifier, wherein
each of the first source-grounded amplifier and the second source-grounded amplifier including:
a transconductance amplifier section including a transistor for converting an AC component of input potential to a current,
a diode load section including a transistor in a diode connection configured as a first load, and
a large-signal distortion compensation circuit configured as a second load connected in parallel with the first load,
each transistor of the first source-grounded amplifier is a P-type MOS transistor, and
each transistor of the second source-grounded amplifier is an N-type MOS transistor.

* * * * *